United States Patent [19]

Sakurai et al.

[11] 4,329,704
[45] May 11, 1982

[54] MOS RANDOM ACCESS MEMORY WITH BURIED STORAGE CAPACITOR

[75] Inventors: Junji Sakurai, Tokyo; Kiyoshi Miyasaka, Yokohama, both of Japan

[73] Assignee: Fujitsu Limited, Kawasaki, Japan

[21] Appl. No.: 76,993

[22] Filed: Sep. 19, 1979

[30] Foreign Application Priority Data

Sep. 20, 1978 [JP] Japan .................................. 53-115276
Dec. 30, 1978 [JP] Japan .................................. 53-165810

[51] Int. Cl.³ ..................... H01L 27/02; H01L 29/78; H01L 29/04
[52] U.S. Cl. ......................... 357/41; 357/24; 357/59
[58] Field of Search ............................ 357/24, 41, 59

[56] References Cited

U.S. PATENT DOCUMENTS

| | | | |
|---|---|---|---|
| 3,947,299 | 3/1976 | Weijland | 357/59 |
| 4,003,036 | 1/1977 | Jenne | 357/24 |
| 4,041,518 | 8/1977 | Shimizu et al. | 357/59 |
| 4,251,828 | 2/1981 | Sakurai | 357/59 |

*Primary Examiner*—Gene M. Munson
*Attorney, Agent, or Firm*—Staas & Halsey

[57] ABSTRACT

A one transistor, one capacitance type dynamic MOS.-RAM is provided with a buried storage capacitor and a planar transfer electrode. The MOS.RAM is, therefore, characterized by a small size of the memory cells and a simple production process. One process feature of the present invention is that a quick diffusion through polycrystalline silicon is employed for forming a vertical connection between the buried storage capacitor and the source or drain of the MOS transistor.

7 Claims, 13 Drawing Figures

4,329,704

MOS RANDOM ACCESS MEMORY WITH BURIED STORAGE CAPACITOR

BACKGROUND OF THE INVENTION

1. Field of the Invention

The present invention relates to a semiconductor memory device, particularly a one transistor, one capacitance type dynamic MOS (metal oxide semiconductor).RAM (random access memory) device, as well as the process for producing the same.

2. Description of the Prior Art

Conventionally, the most common type of MOS.-RAM cells are those in which one MOS transfer gate is combined with one memory capacitor utilizing a so called MOS capacitor. In such type of MOS.RAM cell, the memory capacitor is situated on the same surface of a semiconductor substrate as the transfer gate and occupies a considerable area of 30% or more of the memory cell. Since a constant electrical potential must be supplied to the MOS capacitor from outside of the memory cell, the layout of the elements of the memory device is limited due to the existence of a metal line for supplying the potential to the MOS capacitor.

A dual polycrystalline silicon process, which is employed for the production of the MOS capacitor and the transfer gate, makes the production process of the memory cell complicated, because insulation between the two layers of polycrystalline silicon and a very accurate photolithography process are required. The production yield of the memory cell is decreased, due to the dual polycrystalline silicon structure, from that of the yield of the conventional MOS.RAMs.

Furthermore, the low yield of the MOS.RAMs is attributed mainly to a thin oxide film of the capacitor, which oxide film covers a large surface area of the semiconductor substrate, because such an oxide film is liable to be defective, and further, a gate-oxide short circuit is liable to be caused by fine particles on the silicon of the semiconductor substrate. In addition, stored charges are liable to leak through a path on the substrate surface, which path is formed due to an accidentally contaminated surface portion of the substrate.

A semiconductor memory device, other than that utilizing the MOS capacitor mentioned above, is known from U.S. Pat.No. 4,003,036, in which device a junction capacitance created by a buried diffusion layer in the semiconductor substrate is utilized for a memory capacitor. The memory device disclosed in the U.S. patent mentioned above is a so called VMOS transistor and eliminates all the drawbacks of the memory device utilizing the MOS capacitor. However, a special etching process required for the formation of the V grooves causes a low production yield of the VMOS transistor, which is a problem. In addition, special caution must be taken to prevent the disconnection of the metal lines due to the steep V grooves. It is, therefore, difficult to use conventional aluminum wiring and the like, due to the steep V grooves. Furthermore, the production process of the VMOS transistor and layout of the elements of such transistor cannot be modified freely, which is another disadvantage.

SUMMARY OF THE INVENTION

It is an object of the present invention to provide a semiconductor memory device having a higher integration degree of memory cells than the semiconductor memory device utilizing MOS capacitors.

It is another object of the present invention to utilize as a memory capacitor the junction capacitance of a buried diffusion layer, thereby eliminating all the drawbacks due to the employment of an MOS capacitor as the memory capacitor, and at the same time, to construct the transfer gate in the form of a planar transfer gate, thereby eliminating the drawbacks of the conventional VMOS transistor.

It is a further object of the present invention to provide a simple fabrication process of a semiconductor memory device provided with a buried diffusion layer for the memory capacitor.

In a semiconductor memory device, a single memory cell according to a characteristic of the present invention comprises:
 a substrate comprised of a semiconductor material having one conductivity type;
 a semiconductor growth layer having a single crystalline region and a polycrystalline region, and the same conductivity type as the substrate;
 a buried semiconductor layer of the opposite conductivity type between the substrate and the semiconductor growth layer;
 a buried insulating layer adjacent to the buried semiconductor layer;
 a first single crystalline impurity region of said opposite conductivity type formed at a selected portion of the single crystalline region; and
 a second single crystalline impurity region of said opposite conductivity type extending from the surface of the semiconductor growth layer to the buried insulating layer and being adjacent to said polycrystalline region.

In a process for fabricating a semiconductor memory device, the process for fabricating each memory cell according to the present invention comprises the steps of:
 selectively forming on a surface portion of a semiconductor substrate of one conductivity type a buried semiconductor layer having the opposite conductivity type;
 selectively forming a buried insulating layer on a surface portion adjacent to the buried semiconductor layer;
 growing on the semiconductor substrate provided with the buried layer a semiconductor layer having a single crystalline region and a polycrystalline region, and;
 introducing impurities of said opposite conductivity type into a selected portion of the single crystalline region, so as to form a first impurity region and simultaneously, introducing impurities of said opposite conductivity type into a surface portion extending over the single crystalline and polycrystalline portions, so as to form a second impurity region reaching the buried semiconductor layer.

The present invention will hereinafter be explained with regard to features and embodiments thereof.

In an embodiment of the present invention, a transfer region is defined between the first and second single crystalline impurity regions, and a planar transfer electrode, which is well known in an Si gate MOS.FET, is formed on the transfer region. Such planar structure is possible due to the fact that the buried insulating layer, such as an oxide layer, is employed. Accordingly, the surface unevenness as seen in the VMOSs is eliminated, and thus, all the drawbacks involved in the VMOSs are eliminated.

One of the features of the present invention resides in the fact that the polycrystalline region, which is a portion of the semiconductor growth layer, extends in the form of a column and such columnar polycrystalline region plays an important role in electrically connecting the transfer region with the buried semiconductor layer. It is to be noted in connection with the electrical connection, that the diffusion rate of impurities in the polycrystalline region is three times or more higher than that in the single crystalline region. As a result, during the formation of the first single crystalline impurity region, the second single crystalline impurity region extends in a vertical direction to the buried semiconductor layer, the formation of the second single crystalline impurity region being due to the impurities diffused into the polycrystalline columnar region further diffusing into the single crystalline region via the interface between the polycrystalline and single crystalline regions.

According to another embodiment of the present invention, the second single crystalline impurity region has a shallow portion on the surface of the semiconductor growth layer and a vertical connecting portion extending to the buried semiconductor layer as explained above. The shallow portion of the second impurity region and the first single crystalline region are used as the drain and source of the MOS transistor, respectively, for example. It is possible in this embodiment to produce by a single thermal diffusion the shallow source and drain as well as the deep vertical connecting portion.

According to a further embodiment of the present invention the semiconductor growth layer is fabricated in such a manner that a firstly grown P+(N+) type layer, which has single crystalline and polycrystalline region, has a high impurity concentration in the range of from $5 \times 10^{16}$ to $5 \times 10^{18}$/cm$^3$, and further, a secondly grown P−(N−) type layer, which has single crystalline and polycrystalline portions, has a low impurity concentration in the range of from $5 \times 10^{13}$ to $5 \times 10^{15}$/cm$^3$. The reason for forming the P+(N+) type layer is to prevent an up-diffusion of the N(P) type impurities from the N+(P+) type buried semiconductor layer into the epitaxially grown single crystalline region of the semiconductor growth layer, and thus, converting the conductivity type of this region to N(P) type, and also to enhance a punch-through voltage between the N+(P+) type buried semiconductor layer and the N+(P+) type first impurity region.

According to still another embodiment of the present invention, one of the source and drain electrodes of the MOS transistor comprises an impurity-doped polycrystalline silicon and is formed on the single crystalline and polycrystalline regions of the semicondutor growth layer, in such a manner that said one electrode extends to the boundary between these regions. The other of the source and drain electrodes comprises the impurity-doped polycrystalline silicon and is formed on a portion of the single crystalline region of the semiconductor growth layer. A gate oxide film of the MOS transistor is formed between the source and drain electrodes. The impurities, such as arsenic, may be diffused by a heat treatment, under a non-oxidizing atmosphere, from the source and drain electrodes, thereby diffusing the impurities quickly through the polycrystalline region and, then, permeating the so diffused impurities into the single crystalline region. As a result, the second single crystalline impurity region, so formed by the permeation, extends to the buried semiconductor layer. Simultaneously, the impurities are slowly diffused into the single crystalline region, thereby forming the shallow first single crystalline impurity region. As a result of the diffusion explained above, both impurity regions are formed below the source and drain electrodes and essentially no lateral diffusion of the impurities occurs. The overlapping capacitance between the gate and either of the source or drain is therefore low, and further, a virtual self-alignment is achieved. Furthermore, when the source and drain electrodes are doped into a high concentration of from $1 \times 10^{20}$ to $1 \times 10^{21}$/cm$^3$, the resistance of the source and drain becomes low. In addition, the source and drain can be constructed as thin diffused regions, as stated above, and the diffusion depth is usually from 500 to 3000 Å. Generally, both of the requirements that the source and drain regions of the MOS transistor are shallow and that they have a low resistance should be satisfied in order to provide the MOS transistor with a high speed and a high mutual conductance (Gm). However, these requirements are contrary to each other and it has been difficult to satisfy both of these requirements in the conventional MOS transistor. The present invention, in which these requirements are satisfied, is suitable for an MIS semiconductor device having a short channel length and is suitable for a highly integrated RAM.

The impurity diffusion from the source and drain electrodes is carried out before the formation of the gate electrodes. Accordingly, it is possible to use an aluminum gate electrode, which is suitable for a high speed memory. In the case of using the aluminum gate, the formation of all the oxides in the succeeding stages must rely on a chemical vapor deposition (CVD). The memory device of this embodiment is different from the conventional memory device in the fact that no contact windows for the electrodes are necessary in the memory cells. Therefore, no such problems as deviation of mask alignment in the production of the contact windows, and poor contact between the electrodes and the substrate occurs in this embodiment. In addition, the production yield of the memory device is high, because no photolithographic process is employed for the formation of the contact windows.

According to another embodiment of the present invention, a thick oxide film on the source and drain electrodes, of heavily doped silicon, is formed by a preferential oxidation process at a low temperature of 900° C. or lower, under a moist or wet atmosphere, such as a water-vapor atmosphere. Obviously, the oxide film is also formed on the intermediate surface portion of the lightly doped single crystalline silicon of the semiconductor growth layer between the source and drain electrodes. However, the oxide film is thicker on the heavily doped silicon than the lightly doped silicon, and thus, it is possible to etch the oxide film so as to leave only the thick oxide. Subsequently to the preferential oxidation, for the purpose of forming only the gate oxide film, which is thin, a high temperature oxidation, at a temperature of 1000° C. or higher, is carried out. Accordingly, it is possible to remove any danger of expansion of the impurity-diffusion layers or regions, such as the buried semiconductor layer which is a carrier-storage region of the MOS.RAM, during the heat treatment for the high temperature oxidation.

BRIEF DESCRIPTION OF THE DRAWINGS

Preferable embodiments of the present invention are explained by referring to the drawings, wherein.

DETAILED DESCRIPTION OF PREFERRED EMBODIMENTS

Figure 1:
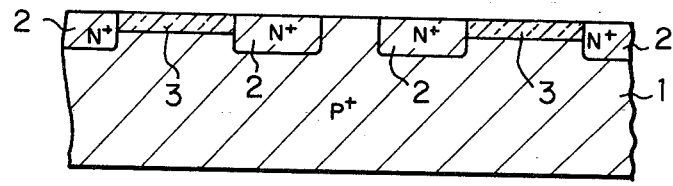
FIGS. 1 through 7 illustrate the production steps of a preferable embodiment of the present invention and show cross sectional views of a pair of memory cells.

In one preferred embodiment illustrated in FIGS. 1 through 7, a pair of memory cells is provided with a common gate-oxide film. However, this embodiment may be modified so that each of the memory cells are provided with its own respective gate oxide film. Referring to FIG. 1, $N^+$ type impurities of arsenic are diffused by a conventional gas-phase diffusion process into a $P^+$ type silicon semiconductor substrate 1 of a resistivity ranging from 0.5 to 1.1 $\Omega$ cm, with the result that $N^+$ type silicon layers 2 of a thickness of from 5000 to 20000 Å are formed. These layers become buried layers in the succeeding step and are referred to herein as $N^+$ type buried silicon layers 2. Subsequently, a silicon dioxide film 3 is selectively formed by thermal oxidation, so as to surround a pair of the $N^+$ type buried silicon layers 2.

Figure 2:
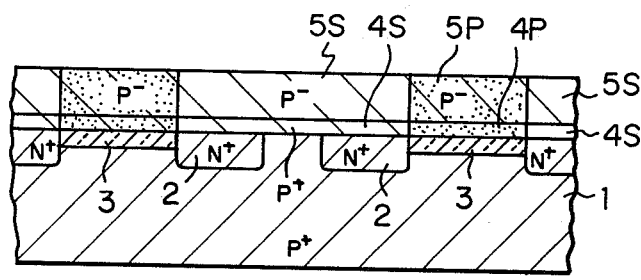

Referring to FIG. 2, a thin $P^+$ type silicon semiconductor growth layer 4S and 4P is firstly formed on the $P^+$ type silicon semiconductor substrate 1 and a thick $P^-$ type or nondoped silicon semiconductor growth layer 5S, 5P is then formed on the thin $P^+$ type silicon semiconductor layer 4P and 4S, by a conventional epitaxial growth process. As a result, a single crystalline region and a polycrystalline region grow on the exposed surface of the $P^+$ type silicon semiconductor substrate 1 and the silicon dioxide film 3, respectively. In FIG. 2, the firstly grown $P^+$ type single crystalline region and polycrystalline region are denoted as 4S and 4P, respectively. These regions 4S and 4P have an impurity concentration of from $5\times10^{16}$ to $5\times10^{18}/cm^3$, preferably from $5\times10^{17}$ to $1\times10^{18}/cm^3$, and a thickness of from 2000 to 3000 Å. In addition, the secondly grown $P^-$ type, single crystalline region and polycrystalline region are denoted as 5S and 5P, respectively. These regions have an impurity concentration of from $5\times10^{13}$ to $5\times10^{15}/cm^3$, preferably from $1\times10^{14}$ to $1\times10^{15}/cm^3$, and a thickness of from 5000 to 10000 Å.

Figure 3:
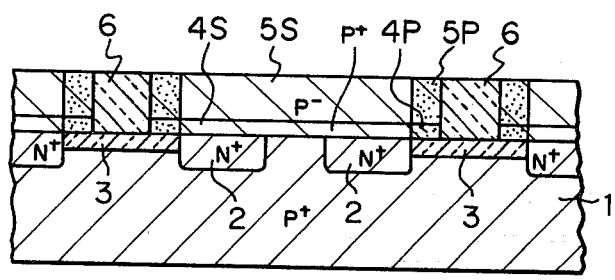

Referring to FIG. 3, an oxide film 6 for isolation is formed by a selective oxidation process on the middle portion of the polycrystalline regions 4P and 5S, so as to isolate the portions of the semiconductor growth layers 4S, 4P, 5S and 5P, which become memory cells, from each other.

Figure 4:
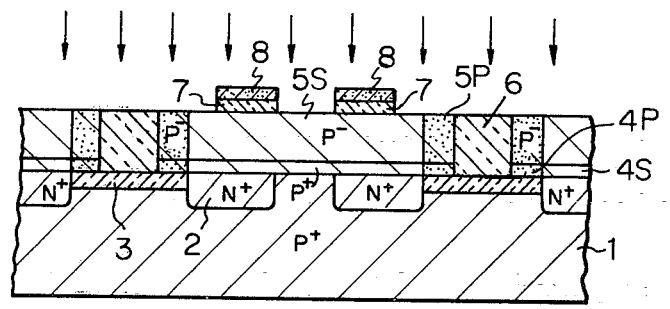

Referring to FIG. 4, a thin silicon dioxide film 7 of a thickness ranging from 200 to 1000 Å is formed by thermal oxidation. Subsequently, a boron ion implantation is performed at a concentration of from $1\times10^{11}$ to $2\times10^{12}$ ions/$cm^2$ and an ion energy of, for example, 50 KeV, so as to implant the boron ions on the entire surface of the silicon dioxide film 7, as shown by the arrows in FIG. 4. By the ion implantation, a threshold voltage Vth of the MOS transistor is adjusted. On the silicon dioxide film 7, a polycrystalline silicon film 8, heavily doped with N type impurities, namely phosphorous or arsenic, is then grown. The polycrystalline silicon film 8 may have a thickness ranging from 3000 to 5000 Å and an impurity concentration ranging from $5\times10^{20}$ to $2\times10^{21}/cm^3$. The silicon dioxide film 7 and the polycrystalline silicon film 8 are then delineated by a conventional photolithography technique, so that the silicon dioxide film 7 and the polycrystalline silicon film 8 are provided with a pattern for the gate insulating film and the gate electrodes, respectively as indicated in the figures.

Figure 5:
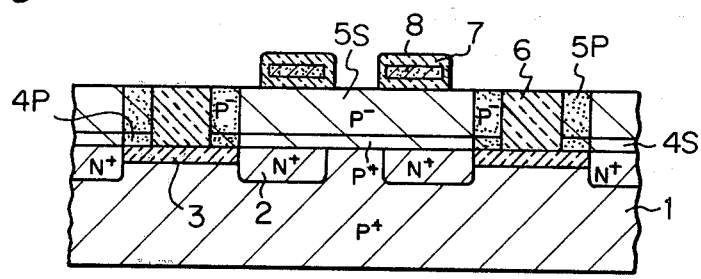

Referring to FIG. 5, the upper portions of an oxide film 7 covering the polycrystalline silicon gate electrodes 8 are formed by thermal oxidation at a low temperature of, for example, from 800° to 900° C., under a moist atmosphere. Although the $P^-$ type single crystalline and polycrystalline regions 5S and 5P, which are not covered by polycrystalline silicon gate electrodes (word lines) 8, are oxidized during the thermal oxidation, the oxide on these regions 5S and 5P has a thickness considerably less than that on the polycrystalline silicon gate electrodes 8, which are heavily doped with the N type impurities. The oxide on the regions 5S and 5P is, therefore, removed by etching after the thermal oxidation. The oxide film 7 is, therefore, left as shown in FIG. 5.

Figure 6:
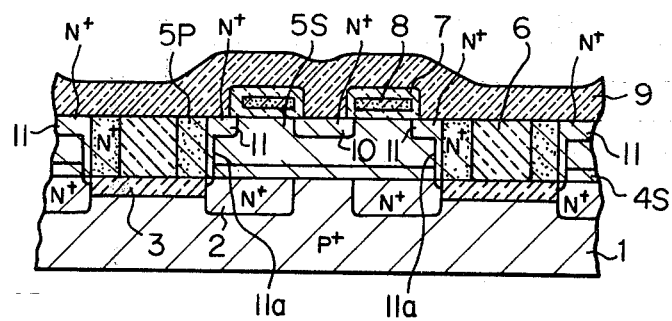

Referring to FIG. 6, a phosphosilicate glass film 9 is grown and a heat treatment at a temperature of from 900° to 1100° C. is carried out, so as to diffuse the phosphorus contained in the glass film 9 into the silicon growth layers 4S, 5S, 5P and 5S. As a result, the first $N^+$ type impurity portion, denoted as 10, is formed on the surface of the single crystalline region 5S. By the impurities diffused from a common portion of the single crystalline and polycrystalline regions, the second $N^+$ type impurity portions, denoted as 11, are formed in the single crystalline regions 5S and 4S. One of these portions 10 and 11 defines the source region and the other defines the drain region.

It is to be noted that, because the $P^-$ type and $P^+$ type polycrystalline regions 5P and 4P, respectively, are entirely changed by the N type impurities to a single $N^+$ type layer during the diffusion mentioned above, this layer is indicated by 5P in FIG. 6. It is also to be noted that $N^+$ type impurity portions 11a of the second single crystalline impurities portions, which constitute a vertical connection between the $N^+$ type buried layers 2 and the drain or source 11, are simultaneously formed with the formation of the source or drain 10.

The technique used for forming the impurity portions 10 and 11 is not limited to the diffusion between the solid phases, and may be any other process, such as ion implantation of arsenic ions.

Figure 7:
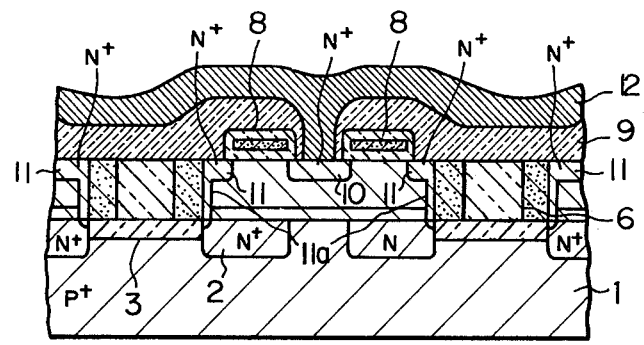

Referring to FIG. 7, the phosphosilicate glass layer 9 is delineated by a conventional photolithography technique into a pattern of an electrode. Subsequently an aluminum film 12 is formed by an evaporation process and is also delineated by a conventional photolithography technique into a pattern electrode and wiring, which are also denoted by 12. The bit lines of the memory device are defined by the electrode and wiring 12.

The structural features of the memory device according to the present invention will be understood from FIG. 7. As the memory capacitor of the memory device, a junction capacitance between the $N^+$ type buried semiconductor layers 2 and the P+ type silicon semiconductor substrate 1 is used. Accordingly, the memory device according to the present invention exhibits a higher integration degree than a memory device using MOS capacitances, and the drawbacks of memory devices using MOS capacitance are completely eliminated in the present invention.

Figure 8:
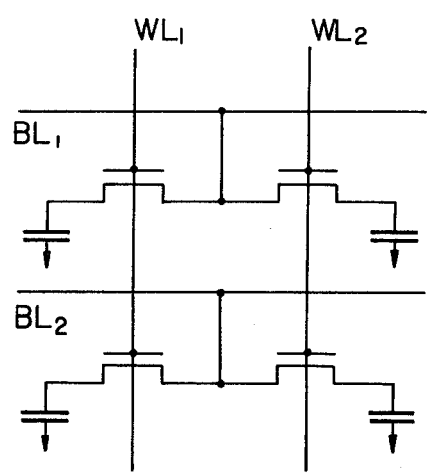
FIG. 8 is an equivalent circuit of the preferable embodiment.

The electrical equivalent circuit of two pairs of memory cells produced as described above is illustrated in FIG. 8. In FIG. 8 the lines $WL_1$ and $WL_2$ represent the word lines formed by the silicon gate electrodes 8 illustrated in FIG. 7, while the lines $BL_1$ and $BL_2$ represent the bit lines formed by the aluminum electrode and wiring 12 illustrated in FIG. 7.

Figure 9:
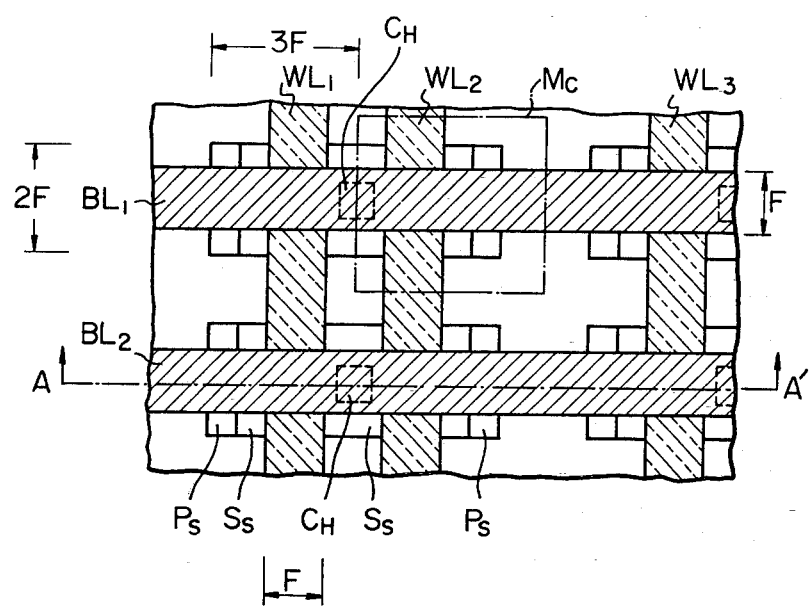
FIG. 9 is a partial plan view of the preferable embodiment.
Figure 10:
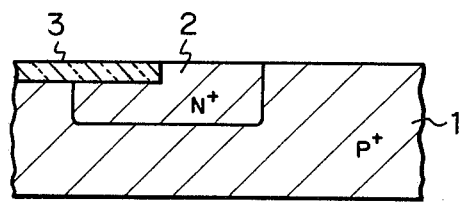
FIGS. 10 through 13 illustrate the production steps of another preferable embodiment of the present invention and show a cross sectional view of a representative part of a memory device.
Figure 11:
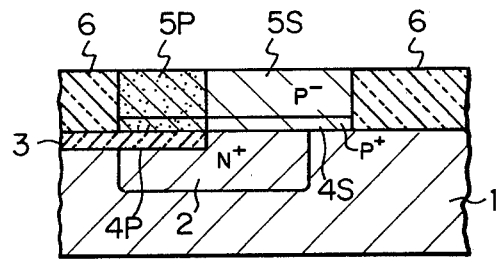

FIG. 9 is a plan view of a representative portion of the semiconductor memory device produced as described above. $C_H$ indicates a contact window of the bit lines $BL_1$ and $BL_2$ with one of the source and drain regions. The area surrounded by the chain line denoted by Mc indicates a single memory cell, Ps represents the polycrystalline silicon regions 5P and 5S reprents the single crystalline regions Ss. The rectangular silicon area Ps and Ss are surrounded by the silicon dioxide covering layer 6 (FIG. 7). FIGS. 1 through 7 are cross sectional views taken along the line A—A', in FIG. 9, in the direction of the arrows.

An important feature of the memory cell of the present invention is a significant reduction of the cell size compared to the conventional one transistor RAM cell. As illustrated in FIG. 9, each of these cells has an area of only $6F^2$ ($3F \times 2F$), where F is the lithographic minimum feature size. The area of the single cell of the conventional one-transistor RAM of 16 k bits or 64 k bits, however, is as large as from 30 $F^2$ to 52 $F^2$.

In FIGS. 10 through 13, illustrating another preferable embodiment of the present invention, portions similar to those in FIGS. 1 through 7 are identically numbered as in FIGS. 1 through 7.

The N+ type layer which becomes the buried layer 2, is formed on the P+ type silicon semiconductor substrate 1 (FIG. 10) by introducing N type impurities into the substrate 1 by a conventional vapor-phase diffusion method. The N+ type layer is referred to herein as the N+ type buried semiconductor layer 2. The silicon dioxide film 3 is formed by a selective thermal oxidation using, for example, silicon nitride as a mask. The silicon dioxide film 3 partially overlaps the N+ type buried semiconductor layer 2.

Subsequently, a thin P+ type silicon semiconductor growth layer 4P and 4S (FIG. 11) and, then, a thick P− type or nondoped silicon semiconductor growth layer 5P and 5S are formed by, for example, a conventional vapor-phase growth process. As a result, the polycrystalline portions 4P and 5P and single crystalline regions 4S and 5S are selectively grown. It should be noted, that the P type impurites may be boron.

A selective oxidation process is then employed for the formation of an isolation oxide film 6, which isolates future memory cells from each other. A chemical vapor-phase growth may be applied for the formation of the isolation oxide film 6.

Figure 12:
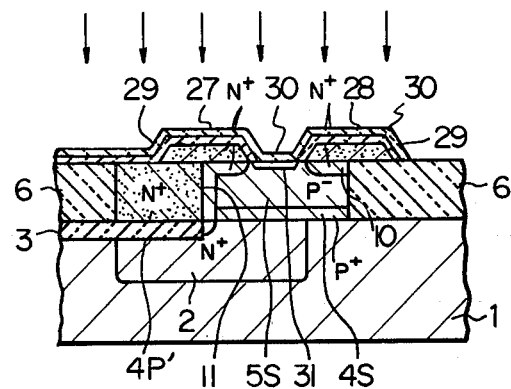

Referring to FIG. 12, a heavily doped polycrystalline silicon film (27, 28) containing arsenic in an amount of from $5 \times 10^{20}$ to $2 \times 10^{21}$/cm$^3$ is grown to a thickness of from 3000 to 6000 Å, for example, approximately 5000 Å, and is then delineated by a conventional photolithography technique to the pattern of the source electrode 27 and the drain electrode 28. A heat treatment in a non oxidizing atmosphere is then carried out, thereby diffusing the arsenic from the source electrode 27 and the drain electrode 28. As a result of the diffusion, the first N+ type impurity portion 10 is formed in the single crystalline region 5S and the second N+ type impurity portion 11, vertically extending to the buried semiconductor layer 2, is simultaneously formed. Due to the arsenic diffusion, the polycrystalline regions 4P and 5P (FIG. 11) are changed to a single N+ type polycrystalline region, which is denoted as 4P' in FIG. 12.

Subsequently, an oxide film 29 is formed by a preferential oxidation in a water-vapor atmosphere at a temperature of from 800° to 900° C., thereby forming the oxide film 29 over the surface of the source electrode 27, the drain electrode 28 and the surface of the P− type single crystalline semiconductor regions 5S between the electrodes 27 and 28. It is easy to form an oxide film having a thickness of from 2000 to 3000 Å over the surface of the source electrode 27 and the drain electrode 28, and to simultaneously form an oxide film (not shown) having a thickness of from 250 to 375 Å over the surface of the P− type single crystalline substrate. The oxide film on the P− type single crystalline semiconductor regions 5S is then removed by an etching, using a solution of hydrofluoric acid (HF), because the oxide film formed by low temperature oxidation is suitable for isolation but does not exhibit a very excellent quality for the gate oxide film. The oxide film 6 on the source electrode 27 and the drain electrode 28 is also etched during the removal of the oxide film mentioned, above. However, such etching presents no problem, because the isolation oxide film 6 is thickly formed, as will be understood from the above explanation. The gate oxide film 30 of, for example, 500 Å thickness, is then formed by oxidation at a temperature of, for example, 1100° C.

For example, boron ions are implanted as indicated by the arrows in FIG. 12 at a concentration of from $1 \times 10^{11}$ to $2 \times 10^{12}$ ions/cm$^2$, so as to adjust the threshold voltage Vth of the MOS transistor. A resistance region 31 is formed by the ion implantation.

Figure 13:
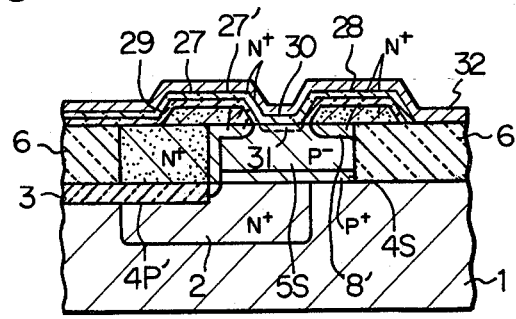

Referring to FIG. 13, a gate electrode and word line 32 is formed from an aluminum or polycrystalline silicon. The drain electrode 28 defines the bit line.

According to the preferable embodiment as explained above, the first and second N+ type impurity portions 10 and 11 and the gate electrode 30 can be produced by self-alignment. In addition, the length of the gate electrode 30 defining the channel length thereunder is very short, and can be reduced to, for example, the photolithographic minimum feature size. The regions or portions of the memory cell explained with reference to FIGS. 10 through 12 and having the same reference numerals as those in FIGS. 1 through 7 may have the same thickness and concentration as those in FIGS. 1 through 7.

It will be obvious to those skilled in the art to which the present invention pertains that the memory device according to the present invention can be written-in or read-out by a conventional operational mode of the one transistor, one capacitance type memory device.

What we claim is:

1. A semiconductor memory device comprising an array of memory cells, each said memory cell comprising:

a substrate of a semiconductor material having a first conductivity type;

a semiconductor growth layer on said substrate including a single crystalline region of the same conductivity type as said substrate and polycrystalline region, said single crystalline region comprising a first layer having a relatively high impurity concentration formed on said substrate and a second layer having a relatively low impurity concentration formed on said first layer;

a buried semiconductor layer of the opposite conductivity type between a selected portion of the area between said substrate and said single crystalline region of said semiconductor growth layer;

a buried insulating layer adjacent to said buried semiconductor layer, said polycrystalline region of said semiconductor growth layer being formed over said buried insulating layer;

a first single crystalline impurity region of said opposite conductivity type formed in a selected portion of said single crystalline region of said growth layer;

a second single crystalline impurity region of said opposite conductivity type extending from the top surface of said semiconductor growth layer to said buried semiconductor layer and being adjacent to said polycrystalline region, and a planar transfer electrode formed over a region separating said first and second single crystalline impurity regions.

2. A semiconductor memory device according to claim 1, wherein said second single crystalline impurity region comprises a shallow portion on the surface of the semiconductor growth layer and a vertical connecting portion extending to said buried semiconductor layer.

3. A semiconductor memory device according to claim 1, wherein said first layer of said single crystalline region of said semiconductor growth layer has an impurity concentration in the range of from $5 \times 10^{16}$ to $5 \times 10^{18}/cm^3$, and said second layer has an impurity concentration in the range of from $5 \times 10^{13}$ to $5 \times 10^{15}/cm^3$.

4. The device of claim 3, said high impurity concentration of said first layer of said single crystalline region of said semiconductor growth layer being in the range from $5 \times 10^{17}$ to $1 \times 10^{18}/cm^3$, and said low impurity concentration of said second layer of said single crystalline region of said semiconductor growth layer being in the range from $1 \times 10^{14}$ to $1 \times 10^{15}/cm^3$.

5. The device of claim 1, 2 or 3, said first layer of said single crystalline region of said semiconductor growth layer having a thickness from 2000 to 3000 angstroms, and said second layer of said single crystalline region of said semiconductor growth layer having a thickness from 5000 to 10,000 angstroms.

6. The device of claim 1 or 2, said low impurity concentration being so low that said second layer of said single crystalline region of said semiconductor growth layer is essentially undoped.

7. The device of claim 1, 2, 3 or 4, each said buried insulating layer of each said memory cell of said array surrounding the respective memory cell and having an oxide portion extending to the surface of said semiconductor growth layer, each said cell comprising two of said buried semiconductor layers, two of said second single crystalline impurity regions respectively connected to said two buried semiconductor layers, one of said first single crystalline impurity regions, and two of said planar transfer electrodes respectively separating said one first single crystalline impurity region from said two second single crystalline impurity regions.

* * * * *

UNITED STATES PATENT AND TRADEMARK OFFICE
CERTIFICATE OF CORRECTION

PATENT NO. : 4,329,704

DATED : May 11, 1982

INVENTOR(S) : JUNJI SAKUAI et al

It is certified that error appears in the above-identified patent and that said Letters Patent is hereby corrected as shown below:

Col. 1, line 17, "type" should be --types--;
"cell" should be --cells--.

Col. 2, line 50, "region, and;" should be --region; and--.

Col 3, line 27, "single crystalline" should be --impurity--;

Col. 7, line 6, "capacitance should be --capacitances--;
line 21, "5S" should be --Ss--;
"reprents" should be --represents--;
line 22, "Ss" should be --5S--;
line 23, "area" should be --areas--.

Signed and Sealed this

Thirtieth Day of November 1982

[SEAL]

Attest:

Attesting Officer

GERALD J. MOSSINGHOFF

Commissioner of Patents and Trademarks